United States Patent
Gibbs et al.

(10) Patent No.: US 8,994,397 B2
(45) Date of Patent: Mar. 31, 2015

(54) THERMAL PAD SHORTS TEST FOR WIRE BONDED STRIP TESTING

(75) Inventors: Byron Harry Gibbs, McKinney, TX (US); Bruce Randall Sult, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 377 days.

(21) Appl. No.: 13/296,663

(22) Filed: Nov. 15, 2011

(65) Prior Publication Data

US 2013/0120019 A1    May 16, 2013

(51) Int. Cl.
| | | |
|---|---|---|
| *G01R 31/00* | (2006.01) | |
| *H02K 9/00* | (2006.01) | |
| *G01R 31/02* | (2006.01) | |
| *H01L 23/00* | (2006.01) | |
| *H01L 23/495* | (2006.01) | |

(52) U.S. Cl.
CPC .............. *G01R 31/025* (2013.01); *H01L 24/45* (2013.01); *H01L 2924/30107* (2013.01); *H01L 23/49541* (2013.01)
USPC ................... 324/762.02; 324/756.02; 361/820

(58) Field of Classification Search
CPC .................. G01R 31/025; H01L 24/45; H01L 2924/30107; H01L 23/49541
USPC ......................... 324/762.02, 756.02; 361/820
See application file for complete search history.

(56) References Cited

U.S. PATENT DOCUMENTS

| | | | | |
|---|---|---|---|---|
| 7,388,396 | B2* | 6/2008 | Lu et al. ................... | 324/754.08 |
| 2005/0278936 | A1* | 12/2005 | Schunk ........................ | 29/592.1 |
| 2006/0018100 | A1* | 1/2006 | Guo ............................ | 361/719 |
| 2008/0078733 | A1* | 4/2008 | Nearman et al. ............. | 211/189 |
| 2012/0086444 | A1* | 4/2012 | Chen et al. ..................... | 324/251 |

* cited by examiner

*Primary Examiner* — Melissa Koval
*Assistant Examiner* — Farhana Hoque
(74) *Attorney, Agent, or Firm* — Steven A. Shaw; Frank D. Cimino

(57) ABSTRACT

A method of testing a packaged semiconductor device under test (DUT) including a leadframe having a plurality of pins and at least one thermal pad with a semiconductor die having topside bond pads wire-bonded by bond wires to the plurality of pins and secured to the thermal pad. A leadframe sheet is provided including a plurality of packaged DUTs including support members that connect to the packaged DUTs. The thermal pads are shorted to one another, and the leadframe sheet is trimmed for electrically isolating the pins from one another. A first electrical contact is provided to the thermal pad. Active pins of the plurality of pins are electrically contacted with a contactor. Automatic testing identifies shorts between the active pins and the thermal pad.

8 Claims, 3 Drawing Sheets

THERMAL PAD SHORTS TEST FOR WIRE BONDED STRIP TESTING

FIELD

Disclosed embodiments relate to the automated testing of wire-bonded packaged semiconductor integrated circuit (IC) devices.

BACKGROUND

Heat dissipation from a semiconductor IC die ("semiconductor die") during operation is typically an important issue, especially as the density of devices on a semiconductor die continues to increase. Also, many semiconductor die now have combinations of high-power transistors and low-power transistors formed on a same die. Such high-power transistors tend to produce more heat as compared to low-power transistors. Furthermore, more system-on-chip (SOC) configurations are being used. Thus, there are often a wide variety of devices on a same semiconductor die. Some of the devices can handle and/or put out much more heat than nearby or neighboring devices on the same semiconductor die. Hence, the reliability and effectiveness of heat dissipation for a packaged semiconductor device may significantly affect the reliability and/or performance of the packaged device during operation.

Some wire-bonded packaged devices have thermal pads that include a surface (generally its bottom surface) that is exposed (not encapsulated) from the package that allows heat conduction away from the semiconductor die during operation to a board onto which the thermal pad is mounted (e.g., typically soldered) in its final application. For example, customers may mount the thermal pad to their sockets with solder similar to conventional device under test (DUT) pins/leads making the joint between the thermal pad and the board both electrically conductive as well as thermally conductive. For this reason in this arrangement, shorts between active (other than no-connect) DUT pins/leads and the thermal pad can result in shorting of the DUT and thus a defect in the DUT's application.

SUMMARY

Disclosed embodiments provide defect identification for wire-bonded packaged devices having a semiconductor integrated circuit (IC) die ("semiconductor die") mounted on a thermal pad that have at least one bond wire that couples a pin of the packaged device to a bond pad on the semiconductor die. The defect if present shorts at least one semiconductor die lead to the thermal pad, which can leads to failures in the wire-bonded packaged device's mounted application. The defect may result when the bond wire inadvertently couples to (e.g., touches) the thermal pad. The defect may also result from a defective (unintentional) leadframe coupling between a lead of wire-bonded packaged device and the thermal pad.

If such coupling occurs, the packaged device may be defective in its final (field) application upon mounting onto a workpiece (e.g., a board). Such field defects can result from an unintended short of the affected bond pad on the semiconductor die to the area of the workpiece (e.g., a ground location on a board) that the thermal pad is mounted to, with one shorting path being from the bond pad via the bond wire through the thermal pad to the board. Such unintended shorting paths can occur due to drooping of a bond wire so that the bond wire touches the thermal pad along its length (e.g., see the depiction in FIG. 1 described below). Another shorting path can be created by an unintended leadframe defect that bridges the space between a lead of the wire-bonded packaged device and the thermal pad.

However, until this Disclosure there was no known strip test method to test for unintended electrical coupling of the thermal pad to a lead of a packaged semiconductor device under test (DUT) lead because the thermal pad is on the opposite side of the leadframe strip from the contactor used to test the DUT. Accordingly, absent the expense of changing the packaging standard to require a dedicated extra bond wire connecting the DUTs' ground pin to the thermal pad, it was not possible for the contactor to make electrical contact with the thermal pad of the DUT. Therefore, there was no cost-effective ability to test such unintended shorting paths that can constitute a defect in the final application for the packaged device.

As used herein a "thermal pad" is a die pad (also known as a die paddle) in a particular arrangement associated with a molded leadframe package, where the semiconductor die is attached to the thermal pad, and the thermal pad includes a surface (generally its bottom surface opposite to the semiconductor die) that is exposed (not encapsulated) from the package that allows contact thereof for conducting heat away from the semiconductor die during operation to a workpiece (e.g., PCB) onto which the thermal pad is mounted (soldered) in its final application. The die attach material between the semiconductor die and the thermal pad is thermally conductive. The thermal pad can comprise copper, copper alloys, or other metals or metal alloys.

Disclosed embodiments recognize that thermal pads are held into position on the bare leadframe, while in sheet/strip form, by support member features rendering thermal pads electrically connected and physically supported to the leadframe (including the other thermal pads associated with other DUTs). This supportive physical connection of the thermal pad to the leadframe provides structural integrity to hold thermal pads in position on the leadframe throughout the various assembly processes. Due to this physical manufacturing requirement, thermal pads are physically and electrically connected to the leadframe while in sheet/strip form. After the packaged DUTs are singulated from the leadframe sheet, other more complex methods are required to contact thermal pads for detection of shorts between the thermal pad and DUT leads.

Disclosed embodiments include methods of testing wire-bonded packaged DUTs including a leadframe having a plurality of pins and at least one thermal pad with a semiconductor die having topside bond pads that are wire-bonded to the plurality of pins and secured to the thermal pad. A leadframe sheet/strip is provided including a plurality of packaged DUTs with structural support members that connect each DUT's thermal pad to the leadframe. Through the support members features thermal pads are shorted to one another and to the leadframe sheet/strip.

The plurality of DUT pins have been trimmed to achieve electrical isolation from the leadframe and from each other. A first electrical contact is provided to the leadframe sheet/strip which also provides electrical connection to the thermal pad by means of the support member features. Active pins of the plurality of pins (as opposed to no-connect pins, if present) are electrically connected to the Automated Test Equipment (ATE) by means of a contactor. Automatic testing identifies a variety of defects that result from a short between any of the active pins and the thermal pad. The test program can detect and report shorts, including but not limiting to, any active DUT pin having a bond wire touching the thermal pad, or a short resulting from frame/strip defects (e.g., "under etched" metal between an active pin and the thermal pad on an etched leadframe).

DETAILED DESCRIPTION

Figure 1:
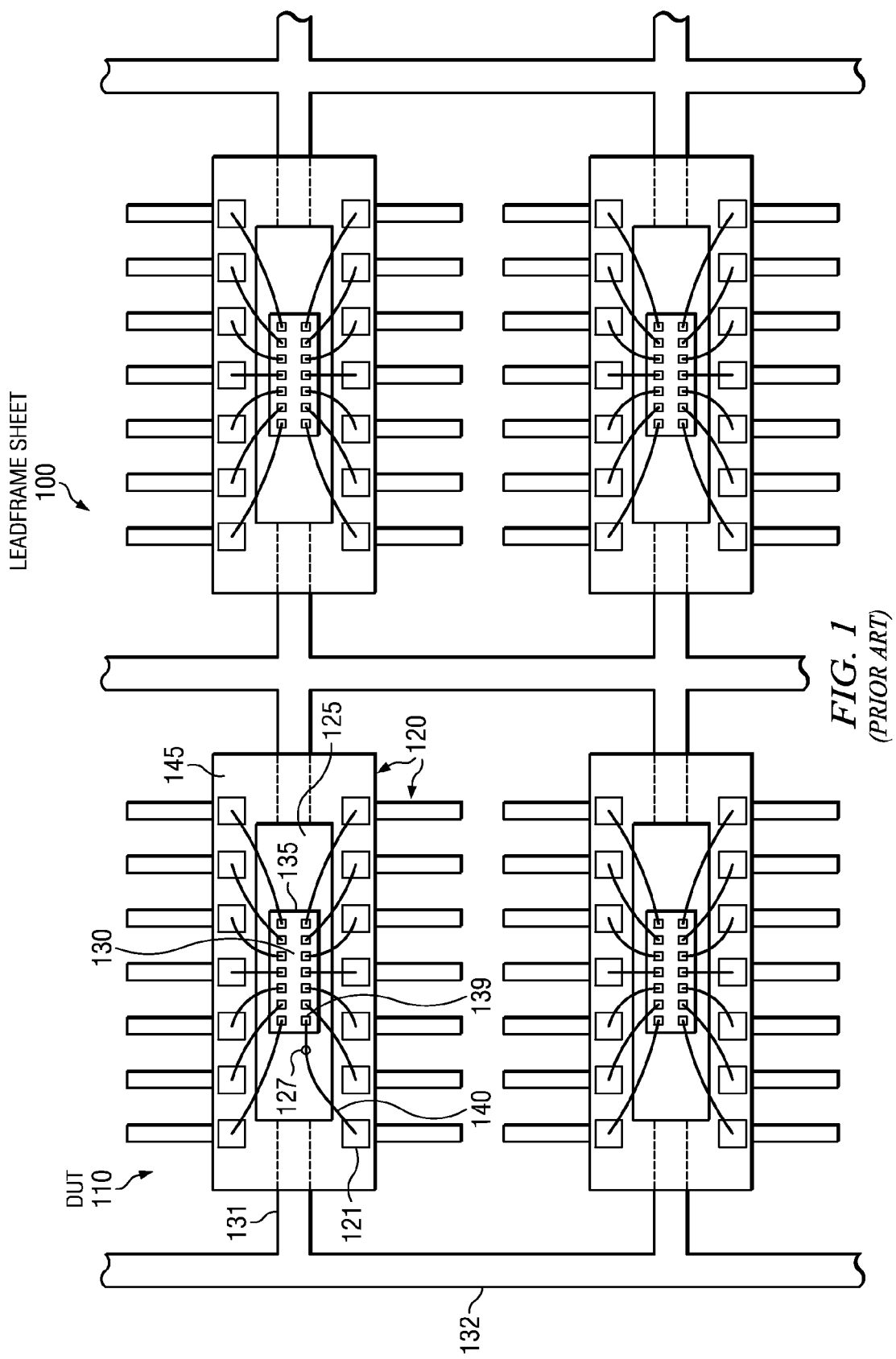
FIG. 1 is a perspective view depiction of a leadframe sheet including a plurality of wire-bonded packaged semiconductor DUTs having thermal pads, with the top encapsulant shown removed to reveal certain details.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a perspective view depiction of a leadframe sheet 100 including a plurality of wire-bonded packaged semiconductor DUTs 110 having thermal pads 125. The DUTs 110 are encapsulated by encapsulant (e.g., mold material) 145 with the top encapsulant shown removed to reveal certain details. Each packaged DUT 110 includes a leadframe 120 having a plurality of pins 121 and at least one thermal pad 125 with a semiconductor die 130 secured to the thermal pad 125 by a die attach adhesive 135. The die attach adhesive 135 is thermally conductive and may also be electrically conductive, such as an Ag filled epoxy.

While in sheet form it has been recognized that the thermal pads 125 are all shorted to one another by support members 131 (dimensions expanded to allowing viewing thereof) connecting the DUT 110 to sheet/strip support members 132. This connection by support members 131 is generally not visible by naked eye viewing, and was instead discovered through Inventor' examination of leadframe design drawings that DUTs with thermal pads are connected to the leadframe through support members 131, with later verification with a multi-meter.

The leadframe sheet 100 is provided trimmed for electrically isolating the pins 121 from one another to allow electrically testing the DUTs 110. As noted above, disclosed embodiments are based on the recognition that leadframe sheets such as leadframe sheet 100 provide an electrical connection to the thermal pads 125 by means of support members 131 and 132, which are utilized for disclosed embodiments to electrically contact the thermal pads 125.

As shown in FIG. 1, bond wire 140 which is intended to couple pin 121 to bond pad 139, droops sufficiently to touch the thermal pad 125 at the location shown at 127. Bond wire 140 thus creates an unintended short between bond pad 139 on the semiconductor die 130 and the thermal pad 125. Disclosed embodiments recognize that if the thermal pads 125 are grounded during sheet testing via contacting vertical support member 132, a conventional shorts test can detect bond wire 140 shorted to the thermal pad 125. As described above, disclosed embodiments also recognize the same conventional shorts test can detect other shorts, including shorts resulting from leadframe/strip defects (e.g., under etched metal between an active pin and the thermal pad on etched leadframe).

Figure 2:
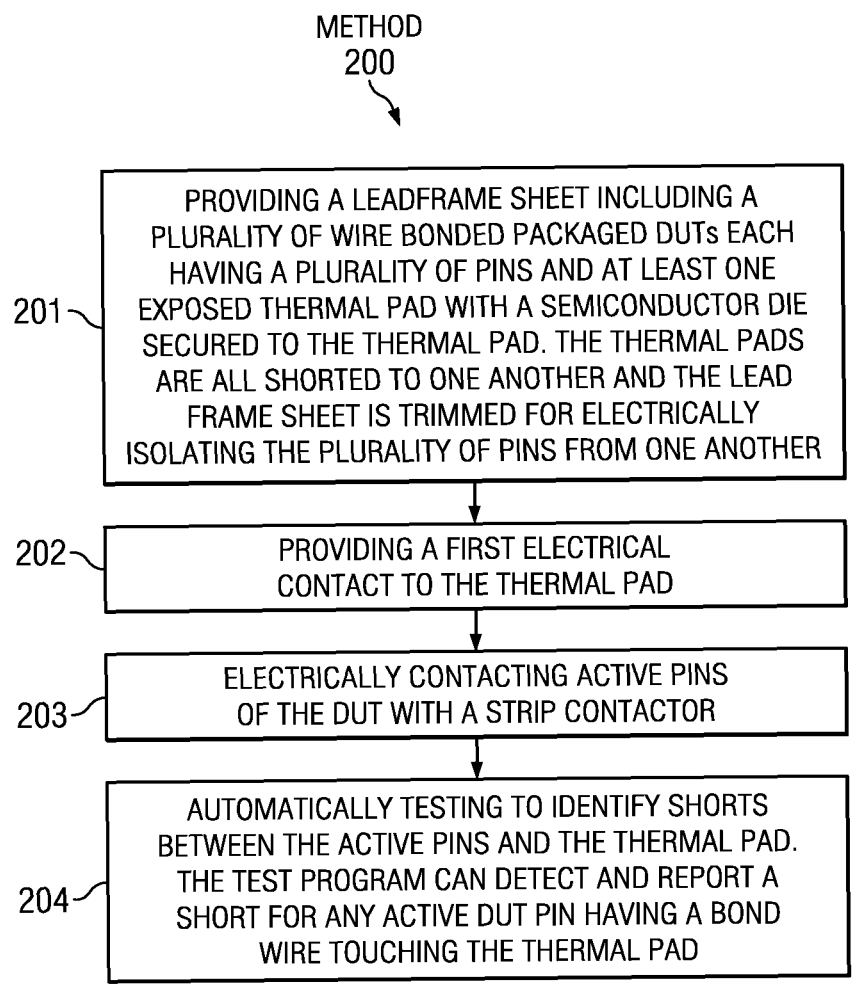
FIG. 2 is a flow chart that shows steps in an example method of testing while in leadframe sheet form wire-bonded packaged DUTs including a leadframe having a plurality of pins and at least one thermal pad with a semiconductor die secured to the thermal pad, according to an example embodiment.

FIG. 2 is a flow chart that shows steps in an example method 200 of testing while in leadframe sheet form wire-bonded packaged DUTs including a leadframe having a plurality of pins and at least one thermal pad with a semiconductor die secured to the thermal pad, according to an example embodiment. The packaged DUT can comprises a molded package that encapsulates the semiconductor die and bond wires with a mold material, wherein a side of the thermal pad opposite the semiconductor die is exposed from the packaged to aid in heat removal. The wire-bonded packaged DUT can comprise a leaded package or a leadless package.

Step 201 comprises providing a leadframe sheet including a plurality of packaged DUTs, wherein the thermal pads are all shorted to one another, with the leadframe sheet being trimmed for electrically isolating the plurality of pins from one another. Step 202 comprises providing a first electrical contact to the thermal pad. In one embodiment the first electrical contact is provided by a first contactor pin of a contactor which contacts an area of the support members.

For example, the first contactor pin can comprise a leadframe grounding pin (see FIG. 3 described below) that may contact an area of vertical support member 132 shown in FIG. 1. By adding one or more disclosed leadframe grounding contact(s) to the contactor, the thermal pads can be grounded allowing detection of a bond wire shorted to ground. It may also be possible to obtain electrical contact to the thermal pads via the support provided by the chuck of the strip handler that the leadframe sheet sits on during testing, which along with the chuck of the strip handler may already be grounded.

Step 203 comprises electrically contacting active pins of the respective DUTs with a strip contactor. Active pins may be contrasted with "no-connect pins" which may be provided by certain devices. As known in the art, for wire-bonded packaged DUTs, DUT pins of the leadframe are coupled to bond pads on the die by bond wires added during the assembly wire-bond process, with the exception of DUT pins designated as "no-connect pins". DUT pins are electrically isolated from the thermal pad with possibly the exception of any designated GND pins which may be intentionally connected to the thermal pad, including both before and after singulation, so that a disclosed shorts test before singulation for a properly assembled wire-bonded device will detect any DUT pin (with the possible exception of any designated GND pins) that is not electrically isolated from the thermal pad.

Step 204 comprises automatically testing to identify shorts between the active pins of the DUT and the thermal pad. The test program can detect and report a short for any DUT such as one having one or more bond wire(s) touching the thermal pad or unintended bridging between the thermal pad and one or more DUT pins. Such defective DUTs can be identified at test, and discarded so that they do not become field failures after reaching the customer and being assembled, such as following mounting of the packaged semiconductor device to a board (e.g., PCB) or other workpiece.

Figure 3:
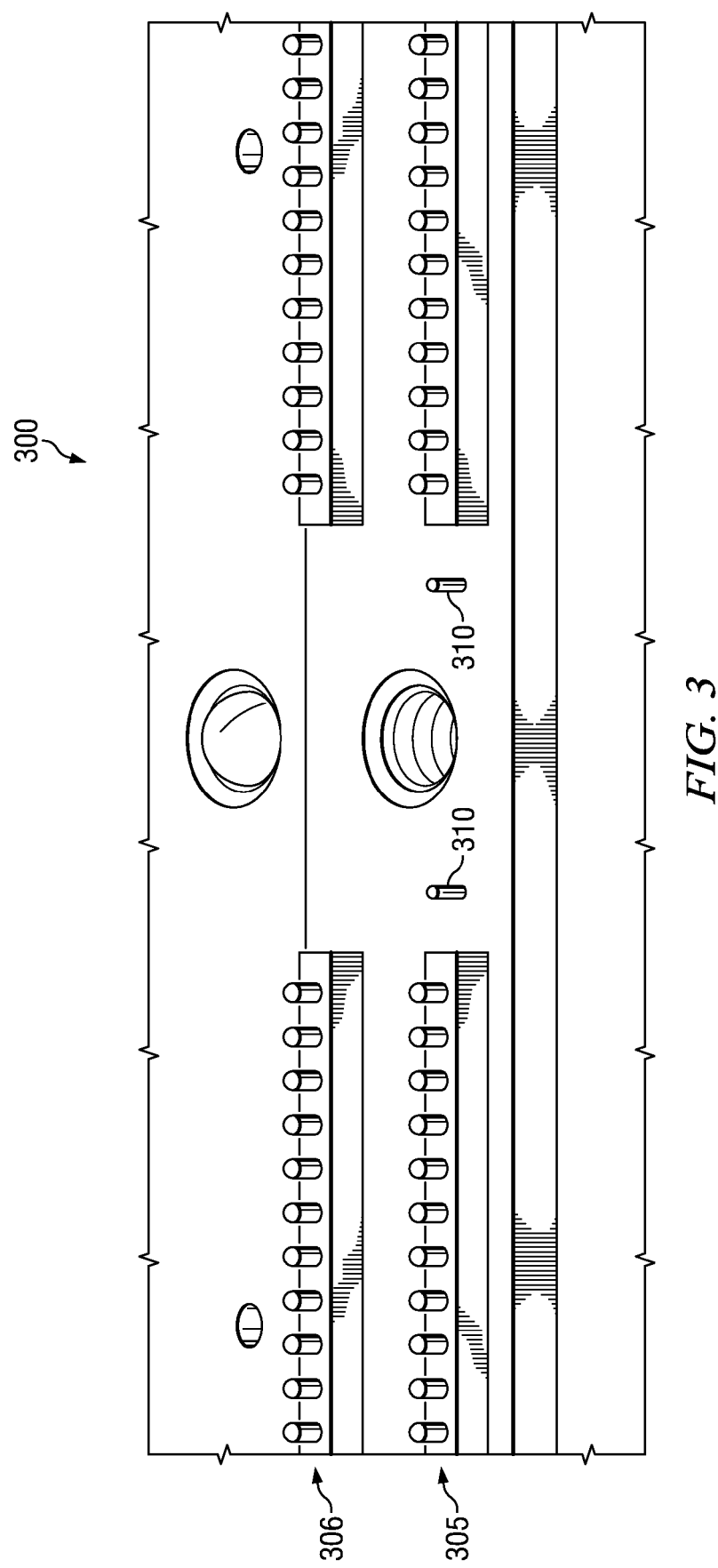
FIG. 3 is a depiction of an example strip contactor including added leadframe grounding pins for contacting the support member of the leadframes, according to an example embodiment.

FIG. 3 is a depiction of an example strip contactor 300 including first rows 305 and second rows 306 of conventional contactor pins with added leadframe grounding pins 310 for contacting the support member of the leadframe, according to an example embodiment. The contactor pins in rows 305 and 306 provide contact to the pin portions that extend beyond the encapsulate 145 as shown in FIG. 1, while the leadframe grounding pins 310 can be positioned to electrically contact the thermal pad 125 via direct physical contact to an area of the vertical support members 132.

Disclosed embodiments can be used to test a variety of different semiconductor devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A method of testing a packaged semiconductor device under test (DUT) including a leadframe having a plurality of pins and at least one thermal pad with a semiconductor die having topside bond pads wire-bonded by bond wires to said plurality of pins, and secured to said thermal pad, comprising:
   providing a leadframe sheet including a plurality of said packaged DUTs including support members that connect to said packaged DUTs, wherein said thermal pads are shorted to one another through said support members, and wherein said leadframe sheet is trimmed for electrically isolating said plurality of pins from one another;
   wire bonding at least one thermal pad to a leadframe grounding pin;
   electrically contacting active pins of said plurality of pins with a contactor; and
   automatically testing to identify shorts between said active pins and said thermal pads.

2. The method of claim 1, wherein said thermal pads are grounded during said automatically testing.

3. The method of claim 1, wherein said packaged DUT comprises a leaded package.

4. The method of claim 1, wherein said packaged DUT comprises a leadless package.

5. The method of claim 1, wherein said packaged DUT comprises a molded package that encapsulates said semiconductor die and said bond wires with a mold material, and wherein a side of said thermal pad opposite said semiconductor die is exposed from said packaged DUT.

6. A method of testing a packaged semiconductor device under test (DUT) including a leadframe having a plurality of pins and at least one thermal pad with a semiconductor die having topside bond pads wire-bonded by bond wires to said plurality of pins, and secured to said thermal pad, comprising:
   providing a leadframe sheet including a plurality of said packaged DUTs including support members that connect to said packaged DUTs, wherein said thermal pads are shorted to one another through said support members, and wherein said leadframe sheet is trimmed for electrically isolating said plurality of pins from one another;
   wire bonding at least one thermal pad to a leadframe grounding pin;
   electrically contacting active pins of said plurality of pins with a contactor, wherein said first electrical contact is provided by a first contactor pin of said contactor that contacts an area of said support members; and
   automatically testing to identify shorts between said active pins and said thermal pad.

7. The method of claim 6, wherein said thermal pads are grounded during said automatically testing.

8. The method of claim 6, wherein said packaged DUT comprises a molded package that encapsulates said semiconductor die and said bond wires with a mold material, and wherein a side of said thermal pad opposite said semiconductor die is exposed from said packaged DUT.

* * * * *